United States Patent
Sarrafzadeh et al.

(10) Patent No.: US 6,442,743 B1
(45) Date of Patent: Aug. 27, 2002

(54) PLACEMENT METHOD FOR INTEGRATED CIRCUIT DESIGN USING TOPO-CLUSTERING

(75) Inventors: Majid Sarrafzadeh, Wilamette, IL (US); Lawrence Pileggi, Pittsburgh, PA (US); Sharad Malik, Princeton, NJ (US); Feroze Peshotan Taraporevala, San Jose, CA (US); Abhijeet Chakraborty, Sunnyvale, CA (US); Gary K. Yeap, San Jose, CA (US); Salil R. Raje, Santa Clara, CA (US); Lilly Shieh, Union City, CA (US); Douglas B. Boyle, Palo Alto, CA (US); Dennis Yamamoto, Los Altos, CA (US)

(73) Assignee: Monterey Design Systems, Sunnyvale, CA (US)

( * ) Notice: Subject to any disclaimer, the term of this patent is extended or adjusted under 35 U.S.C. 154(b) by 0 days.

(21) Appl. No.: 09/097,107

(22) Filed: Jun. 12, 1998

(51) Int. Cl.[7] .............................................. G06F 17/50
(52) U.S. Cl. ............................................. 716/10; 716/9
(58) Field of Search ............................ 716/10, 9, 8, 7, 716/12, 13, 14

(56) References Cited

U.S. PATENT DOCUMENTS

| | | | |
|---|---|---|---|
| 5,491,641 A | 2/1996 | Scepanovic et al. | 716/13 |
| 5,495,419 A | 2/1996 | Rostoker et al. | 700/121 |
| 5,526,517 A | 6/1996 | Jones et al. | 707/8 |
| 5,557,533 A | 9/1996 | Koford et al. | 716/9 |
| 5,636,125 A | 6/1997 | Rostoker et al. | 700/121 |
| 5,661,663 A * | 8/1997 | Scepanovic et al. | 364/490 |
| 5,682,321 A | 10/1997 | Ding et al. | 716/8 |
| 5,682,322 A | 10/1997 | Boyle et al. | 716/2 |
| 5,699,265 A | 12/1997 | Scepanovic et al. | 716/10 |
| 5,712,793 A * | 1/1998 | Scepanovic et al. | 364/490 |
| 5,748,844 A * | 5/1998 | Marks | 706/45 |
| 5,838,585 A * | 11/1998 | Scepanovic et al. | 364/491 |
| 5,854,752 A * | 12/1998 | Agarwal | 364/489 |
| 5,903,461 A * | 5/1999 | Rostoker et al. | 364/468.28 |
| 5,909,376 A * | 6/1999 | Scepanovic et al. | 716/8 |
| 5,955,776 A * | 9/1999 | Ishikawa | 257/618 |
| 6,030,110 A * | 2/2000 | Scepanovic et al. | 364/490 |
| 6,067,409 A * | 5/2000 | Scepanovic et al. | 395/500.09 |

OTHER PUBLICATIONS

Fiduccia et al., "A Linear–Time Heuristic for Improving Network Partitions", *IEEE 19th Design Automation Conference*, pp. 175–181 (1982).

Huang et al., "Partitioning–Based Standard–Cell Global Placement With an Exact Objective", *International Symposium on Physical Design*, pp. 18–25, ACM (1997).

Kernighan et al., "An Efficient Heuristic Procedure for Partitioning Graphs", *Bell System Technical Journal*, 49:291–307 (1970).

Kleinhans et al., "Gordian: VLSI Placement by Quadratic Programming and Slicing Optimization", *IEEE Transactions on Computer–Aided Design*, 10(3):356–365 (1991).

(List continued on next page.)

*Primary Examiner*—Vuthe Siek
(74) *Attorney, Agent, or Firm*—Vierra Magen Marcus; Harmon & DeNiro LLP

(57) ABSTRACT

The disclosure describes a placement method for the physical design of integrated circuits in which natural topological feature clusters are discovered and exploited during the placement process is disclosed. Topo-clusters drive initial placement, with all of the gates of a topo-cluster being placed initially in a single bin of the placement layout or within a group of positionally-related bins. An iterative placement refinement process is done using a technique referred to as Dual Geometrically-Bounded FM (GBFM). GBFM is applied on a local basis to windows encompassing a number of bins. From iteration to iteration, windows may shift position and vary in size. When a region bounded by a window meets a specified cost threshold in terms of a specified cost function, that region stops participating. Following the foregoing global placement process the circuit is then ready for detailed placement in which cells are assigned to placement rows.

13 Claims, 9 Drawing Sheets

OTHER PUBLICATIONS

Sarrafzadeh et al., "NRG: Global and Detailed Placement", *IEEE International Conference on Computer–Aided Design*, pp. 532–537 (1997).

Suaris et al., "Quadrisection: A New Approach to Standard Cell Layout", *IEEE International Conference on Computer–Aided Design*, pp. 474–477 (1987).

* cited by examiner

○ Algorithm GBFM_one_level(w,s,r)

for (i= 1 to r)

for (j= 0 to s-1)

{ Consider the a wxw grid superimposed on the bins.

Shift the grid up and right by s units.

Perform GBMF within each wxw window

○ Algorithm dual_GBFM for (temp= t down to 1)

{ for (i= 1 to k)  // k should be a small constant like 3

{ while (there exists a region with cost > cost(t) or

{ Reg = a region randomly selected among regions with cost

Perform quanto-cluster level FM within Reg.

} // end of while while (there exists a region with cost > cost(t) or

{ Reg = a region randomly selected among regions with cost

Perform gate level FM within Reg.

} // end of while

} // end of for i

} // end of for temp

FIG. 10

Input circuit

Seven topoclusters

Placement refinement
global move

Placing topoclusters
in the bins

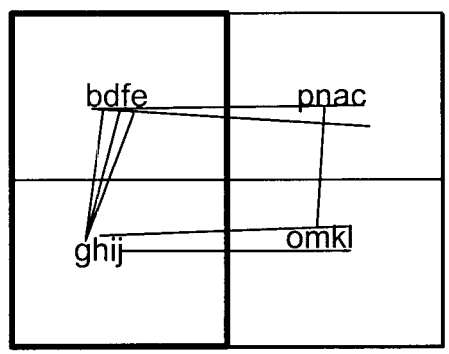
Placement refinement
local move
FIG. 15
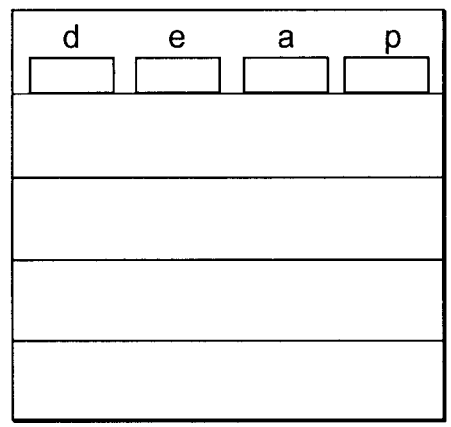
FIG. 16
FIG. 17
FIG. 18
Done
Router

PLACEMENT METHOD FOR INTEGRATED CIRCUIT DESIGN USING TOPO-CLUSTERING

This application is related by subject matter to U.S. application Ser. No. 09/097,299 filed on Jun. 12, 1998 entitled METHOD FOR DESIGN OPTIMIZATION USING LOGICAL AND PHYSICAL INFORMATION, filed on even date herewith and incorporated herein by reference an now U.S. Pat. No. 6,286,128.

BACKGROUND OF THE INVENTION

1. Field of the Invention

The present invention relates to placement in integrated circuit design.

2. State of the Art

The physical design of integrated circuits involves placement of gates within a design layout, representing a physical integrated circuit, and routing of interconnections (nets) between gates. The logical integrated circuit design is represented in the form of a netlist, i.e., a list of gates or collections of gates (macros) and nets interconnecting them. A graph representation of a netlist is shown in FIG. 1A. Through placement and routing, the logical integrated circuit design is translated to a physical integrated circuit design. Placement and routing are performed using Electronic Design Automation (EDA) software tools running on powerful computers.

Placement and routing are closely inter-related. As integration density increases, the sheer size of integrated circuit designs challenges current methods of physical design. Furthermore, physical design is required to be more exacting in order to avoid deleterious interactions and to ensure that all design constraints are met.

A number of approaches to the placement problem have been proposed, including simulated annealing, genetic algorithms, mathematical/linear programming, bisection type approaches, etc. One widely-practiced partitioning algorithm known as FM after its originators Fiduccia and Matheyses, is used as the basis for many placement algorithms. In FM, groups of features are formed, and features are exchanged between the groups so as to minimize the number of nets extending between the groups. The FM technique, an example of a module partitioning heuristic, may be represented as follows:

1. Determine initial partition of modules.
2. Loop until no more improvement in the partition results, or until a maximum number of passes is tried:
    a. Free all modules and compute module gains.
    b. Loop while there remains a free module that can be moved:
        i. Select next module to be moved (select free module of maximum gain, subject to area-balance criterion).
        ii. Move selected module to opposite side of partition.
        iii. Update module gains.
    c. Reconstruct best partition of pass.

Gain refers to decrease in the number of nets crossing between opposite sides of the partition.

A major shortcoming of the foregoing technique, as well as other similar techniques, is that after a partition has been made, it is difficult or impossible for gates or modules to cross the partition boundary. This restriction often results in inferior placements. A cycling and overlapping partitioning process is described in Huang and Kahng, Partitioning-Based Standard Cell with an Exact Objective, *Proc. of the International Symposium on Physical Design,* April 1997. This approach, to a limited extent, does allow gates and modules to cross partition boundaries. However, the approach is not cluster-based (is slow) and does not exploit the full power of cycling and overlapping partitioning (produces less-than-adequate quality).

In short, none of these existing placement techniques appears well-equipped to meet the challenges of the deep sub-micron era.

SUMMARY OF THE INVENTION

The present invention, generally speaking, provides a placement method for the physical design of integrated circuits in which natural topological feature clusters (topo-clusters) are discovered and exploited during the placement process. Topo-clusters may be formed based on various criteria including, for example, functional similarity, proximity (in terms of number of nets), and genus. Genus refers to a representation of a netlist in terms of a number of planar netlists—netlists in which no crossing of nets occurs. Topo-clusters drive initial placement, with all of the gates of a topo-cluster being placed initially in a single bin of the placement layout or within a group of positionally-related bins. The portion of a topo-cluster placed within a given bin is called a quanto-cluster. An iterative placement refinement process then follows, using a technique referred to herein as Geometrically-Bounded FM (GBFM), and in particular Dual GBFM. In GBFM, FM is applied on a local basis to windows encompassing some number of bins. From iteration to iteration, windows may shift position and vary in size. When a region bounded by a window meets a specified cost threshold in terms of a specified cost function, that region does not participate. The cost function takes account of actual physical metrics—delay, area, congestion, power, etc. "Dual" refers to the fact that each iteration has two phases. During a first phase, FM is performed within a region on a quanto-cluster basis. During a second phase, FM is performed within the region on a gate basis. GBFM occurs in the context of recursive quadrisection. Hence, after GBFM has been completed, a further quadrisection step is performed in which each bin is divided into four bins, with a quarter of the gates of the original bin being placed in the center of each of the resulting bins. GBFM then follows, and the cycle repeats until each bin contains a fairly small number of gates. Following the foregoing global placement process, the circuit is then ready for detailed placement in which cells are assigned to placement rows.

BRIEF DESCRIPTION OF THE DRAWING

The present invention may be further understood from the following description in conjunction with the appended drawing. In the drawing:

FIG. 9 is a pseudo-code representation of a placement refinement process;

FIG. 10 is a pseudo-code representation of a placement refinement process in accordance with an alternative embodiment.

FIG. 15 is a diagram showing the results of a local move during placement refinement;

FIG. 16 is a diagram showing the results of quadrisection following the move of FIG. 15;

FIG. 17 is a diagram showing row placement of cells represented by the nodes a–k;

FIG. 18 is a diagram of a final routed integrated circuit produced by the foregoing steps;

DETAILED DESCRIPTION OF THE PREFERRED EMBODIMENTS

The present placement method is guided by a number of important decisions that contribute to the overall strength of the placement method. First, the placement method is based on clustering. Present day designs are too large to be considered in flat mode. Gates must therefore be clustered to reduce the design space. Second, the placement method is based on quadrisection techniques. Quadrisection techniques are extremely fast as compared to annealing or mathematical programming methods. Quadrisection, as opposed to bisection, better models the two-dimensional nature of the placement problem. Third, the placement technique allows for gates to cross quadrisection boundaries.

Figure 8:
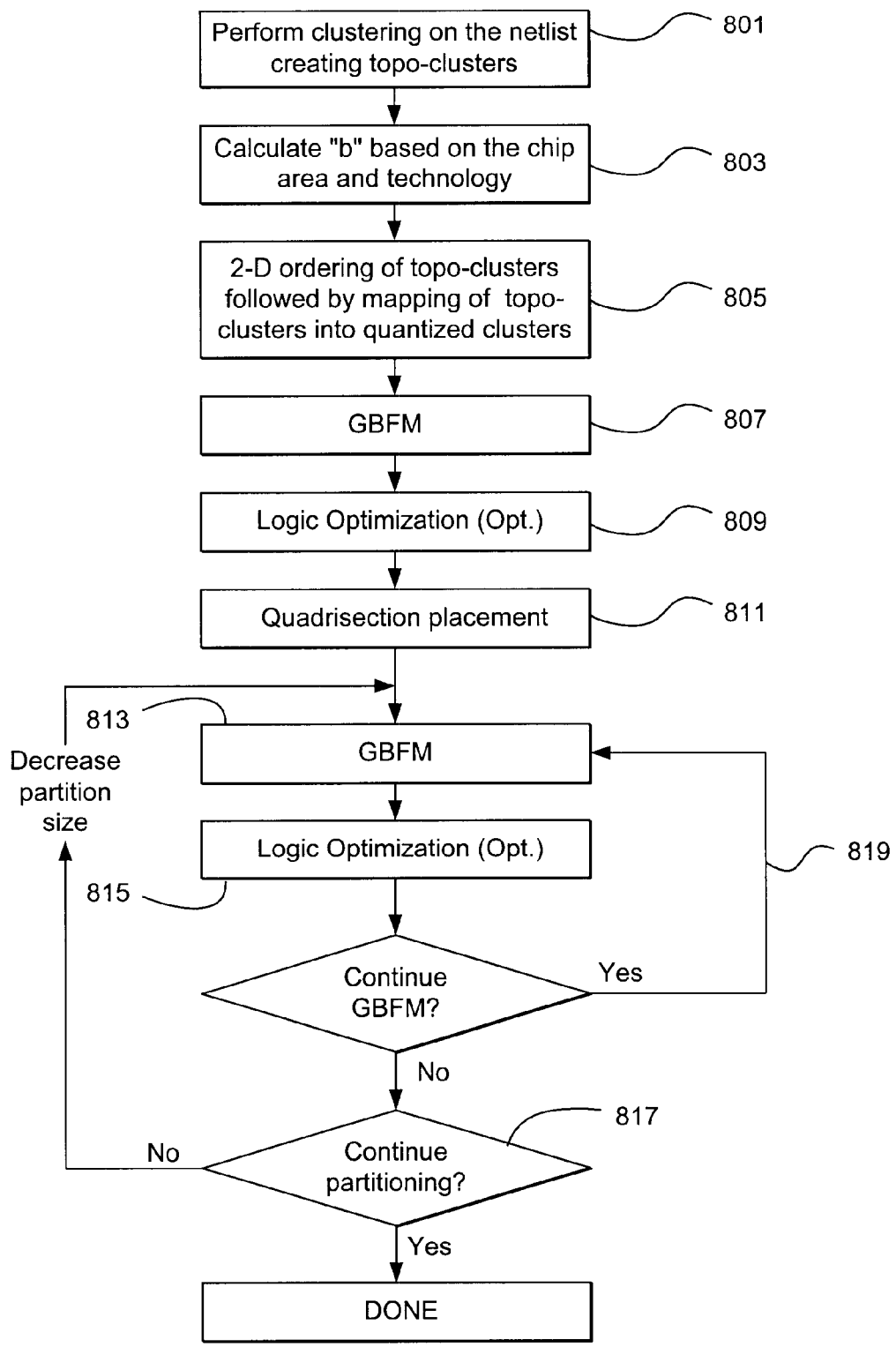
FIG. 8 is a flow diagram illustrating the placement process.

Referring to FIG. 8, a flow diagram of the present placement method is shown. The input to the placement process is assumed to be a netlist. In Step 801, clustering is performed on the netlist, creating topo-clusters. Then a layout layout is formed as an array of b×b "bins." The number of bins b is determined based on technology-specific considerations (803). A 2-D ordering of topo-clusters is then performed, followed by mapping of topo-clusters into "quanto-clusters" (805). A quanto-cluster is a bin-size portion of a topo-cluster, and may include the entire topo-cluster. A cycling and overlapping partitioning process is then performed (807), referred to herein as Geometrically Bounded FM, or GBFM, described in greater detail hereinafter. Logic optimization may optionally be performed (809), after which quadrisection is performed (811). During quadrisection, each bin is divided into four bins one-fourth the size. A loop then ensues of GBFM (813), optional logic optimization (815), and quadrisection (811), until the bins each contain a relatively small number of gates, e.g. ten or a few tens of gates. Partitioning is then discontinued (817). Nested within this outer loop is an inner loop 819 within which GBFM may be performed repeatedly.

Figure 1A:
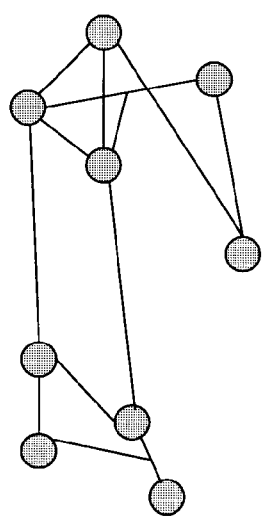
FIG. 1A is a diagram representing a nedlist.
Figure 1B:
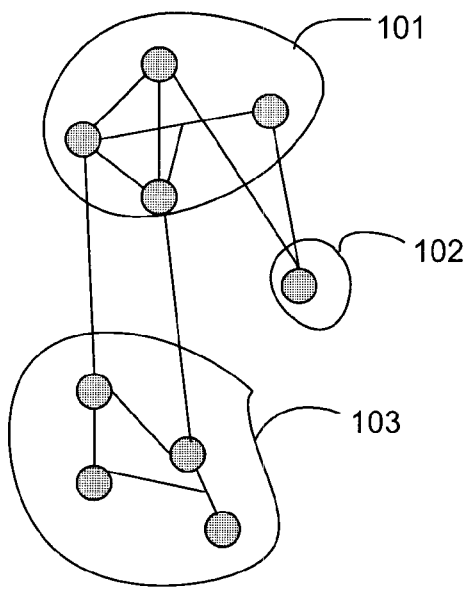
FIG. 1B is a diagram in which topo-clusters have been identified within the netlist of FIG. 1A.
Figure 1C:
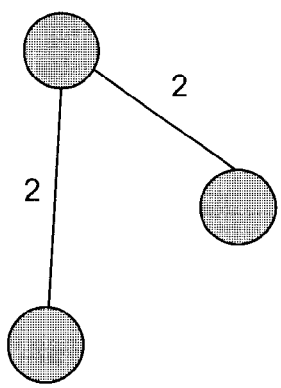
FIG. 1C is a course netlist in which the topo-clusters of FIG. 1C are each represented as a single feature.

The concept of clustering is illustrated in FIG. 1B. During clustering, topologically-related circuit elements are grouped together. In FIG. 1B, three clusters are shown, clusters 101, 103, and 105. Following clustering, the circuit may be represented in the form of a coarse netlist in which clusters are elemental and are joined by inter-cluster nets.

Clustering may be accomplished by various techniques including, for example, techniques based on functional similarity, netlist distance, and genus analysis. Each of these variations will be described in turn.

The nature of netlists makes clustering based on functional similarity quite straightforward. Each cell instance is given a unique name. Related cell instances are given cell names that are quite evidently related. For example, a register might be composed of some number of flip-flops. These flip-flops may have the instance names top/u1/registers/control_ff[7], top/u1/registers/control_ff[6], . . . , top/u1/registers/control_ff[0]. A netlist parser may readily form clusters based on instance name relatedness. Alternatively, information concerning functional relatedness may be determined during logic synthesis based on a high level (e.g., Verilog, VHDL) description and preserved within the netlist format itself. The latter approach is preferable in that functional relatedness is best determined based on a high-level description, but may not be possible if the input netlist does not already include information concerning functional relatedness.

In distance-based clustering, whether two gates belong to the same cluster is determined based on a distance measure. The distance of two gates in a circuit can be defined as the minimum number of nets (or gates) visited in going from the first gate to the second. A bottom-up clustering method is used. Initially, each circuit element is its own cluster. Clusters are then merged to form larger clusters, based on distance considerations.

Figure 2:
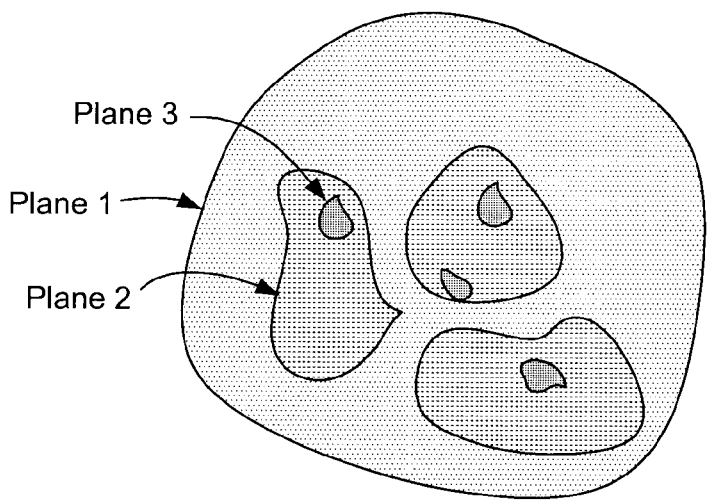
FIG. 2 is a diagram representing a netlist with genus 3.

Clustering may also be performed based on hyper-graph analysis of the netlist graph. A hyper-graph is a graph in which each edge of the graph may have multiple endpoints. A planar graph is one in which no graph edges cross. The genus of a hyper-graph is the number of planar sub-graphs needed to represent it. FIG. 2 shows a representation of a netlist having genus 3. Genus analysis of a hyper-graph may be performed as follows. First a maximal planar netlist of the original netlist is obtained. This planar netlist is said to be on plane 1. The planar netlist is deleted and a new planar netlist is obtained. The second planar netlist is said to be on plane 2. This process repeats until all nets have been removed. The total number of planes obtained is called the genus of the (original) netlist. This process provides insight into the complexity of the netlist. Furthermore, regions that are highly non-planar (as determined by the above analysis) can be clustered together.

Clusters formed by any of the foregoing methods, or by other methods that take into account circuit topology, are referred to as natural clusters or topological (topo) clusters.

The identification of clusters may involve trial and error. The following cost function may be used in evaluating the quality of a topo-clustering:

$$Kij = (Pij-1)/(Ti-1)$$

where Kij is the "credit" of net Ni in cluster j, Pij is the total number of terminals of net Ni in cluster j and Ti is the total number of terminals of net i. The absorption cut benefit, K, is defined as the summation of Kij over all nets and all topo-clusters. If m denotes the number of topo-clusters, a good topo-clustering is one with large values of K and m.

The usefulness of topo-clusters is evident in both obtaining a good initial placement of circuit elements and in performing placement refinement. Using topo-clusters, the initial placement may be expected to have a significantly lower cost function (and hence be significantly closer to the final placement) than if topo-clusters are not used. Also, using topo-clusters, the cost function of the placement may be reduced in a more computationally-efficient manner.

Figure 3:
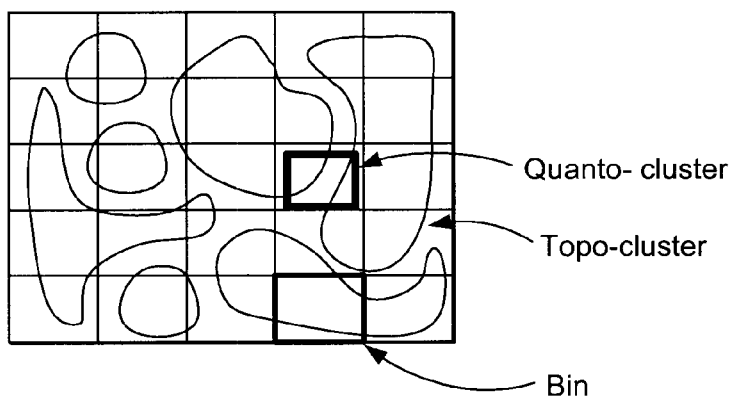
FIG. 3 is a simplified diagram representing an initial placement of topo-clusters on a placement layout, resulting in quanto-clusters.

In one exemplary embodiment, initial placement is performed by, beginning in the center of the design layout, using the bins in a predetermined spiral order to place each cluster in turn in as many bins as required by the cluster, as shown in FIG. 3. In placing topo-clusters, the topo-clusters become "bin-quantized" to form quanto-clusters. In an alternative embodiment, initial placement is performed in serpentine fashion, e.g., in row-major order for a first row of bins, reverse-row-major order for a succeeding row of bins, then row-major order again, etc. Preferably, topo-clusters are not placed in random order but rather are ordered based on a measure of the inter-relatedness of different topo-clusters.

Following initial placement, placement refinement occurs. Placement refinement is performed iteratively, each iteration involving quadrisection followed by a variant of FM, referred to herein as Dual GBFM. "Dual" refers to the fact that moves are performed first at the quanto-cluster level and then at the gate level. Dual GBFM differs from conventional FM in numerous respects, including the following:

1. Initial placement has already been performed. Moves may therefore be evaluated based on an actual physical cost function, e.g., one that measures congestion (routability), area, timing improvement, power, etc.
2. GBFM is applied selectively (by region) and iteratively. Conventional FM, in general, is applied universally and recursively.
3. Moves include cluster-level moves, followed by gate-level moves.
4. GBFM is multi-way. Although the possibility of multi-way FM has been recognized, virtually all commercial applications of FM have been two-way because of the large computational cost of multi-way FM. Using a shifting-window approach, GBFM achieves a comparable effect as large multi-way FM but in a way that is computationally manageable.

Figure 4A:
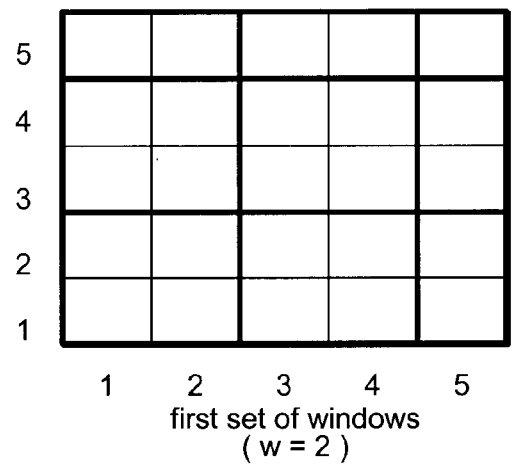
FIG. 4A is a diagram showing a first set of windows used to perform GBFM.
Figure 4B:
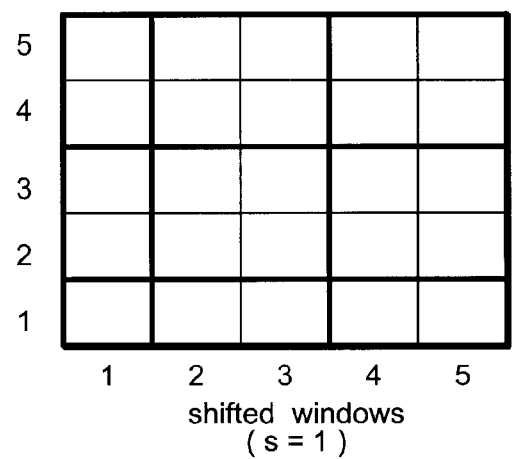
FIG. 4B is a diagram showing a second shifted set of window.

The GBFM process allows cells assigned to one partition to freely move to another partition using a controlled mechanism. GBFM, in accordance with exemplary embodiments, is described by the pseudo-code routines of FIG. 9 and FIG. 10. Referring first to FIG. 9, at a particular level of quadrisection, a window-pane overlay is applied to the design layout, as illustrated in FIG. 4A. GBFM is performed within each window. GBFM is multi-way FM using a geometric cost function, i.e., a cost function that is a function of distance, area, etc., not merely a function of "cuts" (topology). The windows are then redefined by shifting the window-pane overlay such that the new windows partially overlap the previous windows, as illustrated in FIG. 4B, and the process is repeated. The parameters w, s and r define a window size, a shift amount, and the number of repetitions (or rounds), respectively. In early stages of the placement process, the value of w should be large, and r should also be large. In later stages of the placement process, w should be small, s can be larger, and r should be small. The three parameters may be adjusted as a function of the given netlist, based on topo-clusters. For example, if analysis reveals a large number of disconnected topo-clusters, then w may be small, s may be large and r may be small. The large number of disconnected topo-clusters makes the problem easier, hence the window size may be reduced, saving work for the algorithm. In general, the parameters w, s and r may be determined empirically for different types of circuit layout problems; thereafter, the algorithm may be "tuned" for different circuit layout problems by adjusting the parameters w, s and r.

GBFM operates both on a quanto-cluster (bin) basis (first half of GBFM) and on a gate basis (second half of GBFM).

Referring to FIG. 10, in accordance with an alternative embodiment, GBFM uses a notion of temperature (as in simulated annealing, for example). The result of introducing the notion of temperature is that initially only moves that will result in fairly substantial improvement in the cost function are considered (high temperature, high cost threshold). In later stages, moves that will result in more modest improvement are considered (low temperature, low cost threshold). Instead of considering a large number of regions (windows) systematically and exhaustively, regions are randomly selected based on temperature and cost. Computational savings may therefore result. In an exemplary embodiment, at each temperature, a small number of iterations of GBFM are performed.

Figure 5:
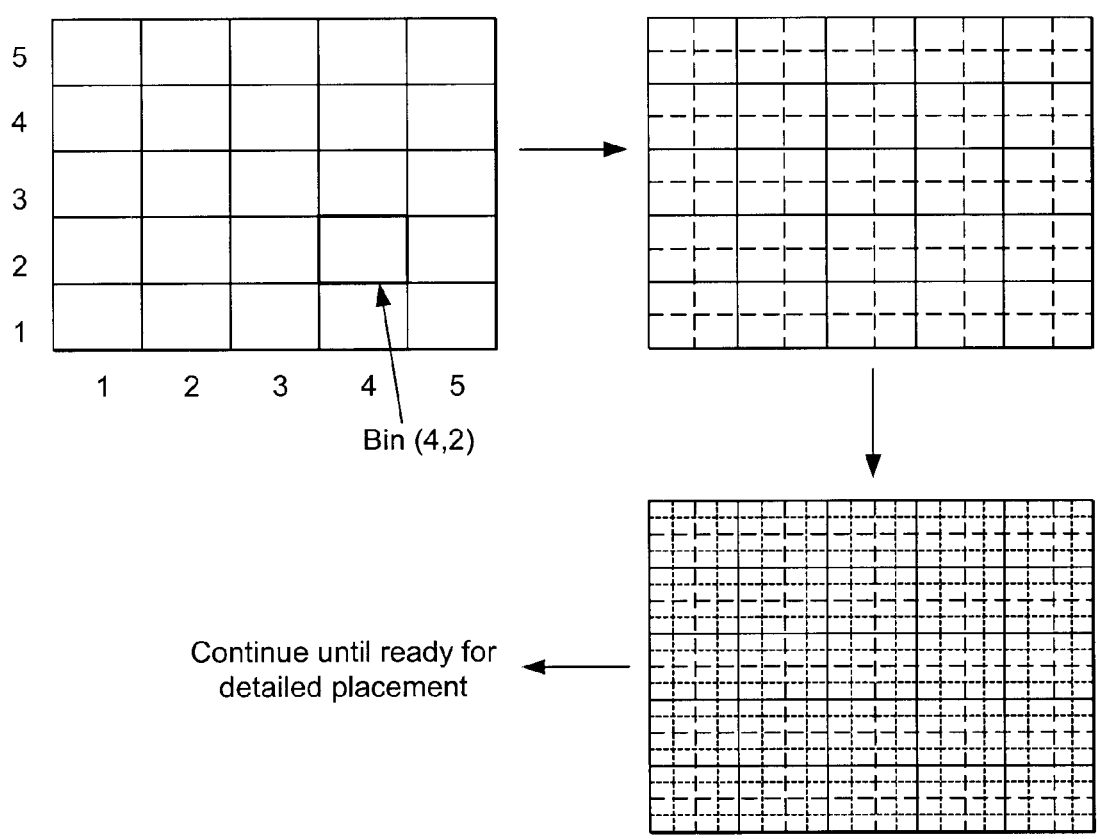
FIG. 5 is a diagram representing a quadrisection process.
Figure 6:
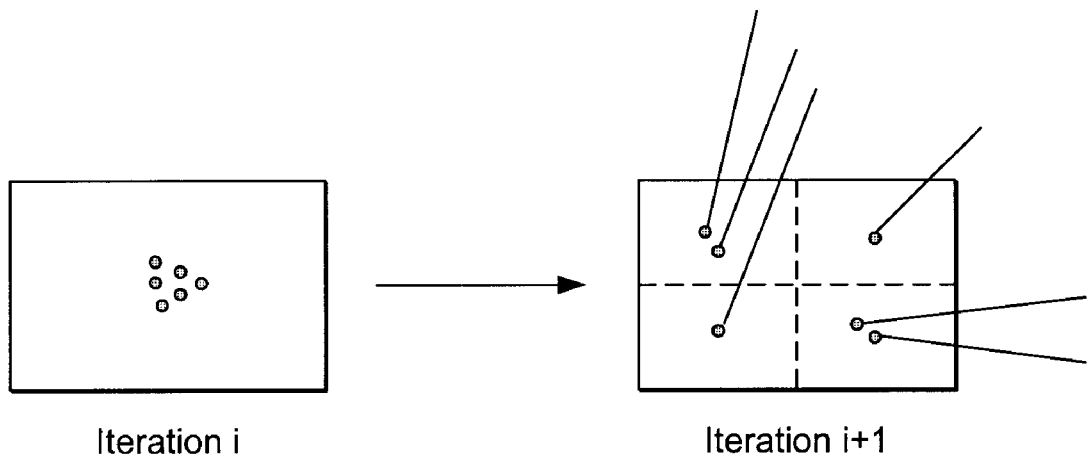
FIG. 6 is a diagram representing quadrisection in greater detail.

Following GBFM, quadrisection is again performed as illustrated in FIG. 5. During quadrisection, the circuit elements are divided into fourths, with one fourth of the circuit elements being placed in each of four new bins, as illustrated in FIG. 6. The circuit elements are placed in the center of the new bins. Quadrisection is followed again by GBFM This process repeats until each bin contains a small number of gates, e.g. ten or a few tens of gates.

Figure 7:
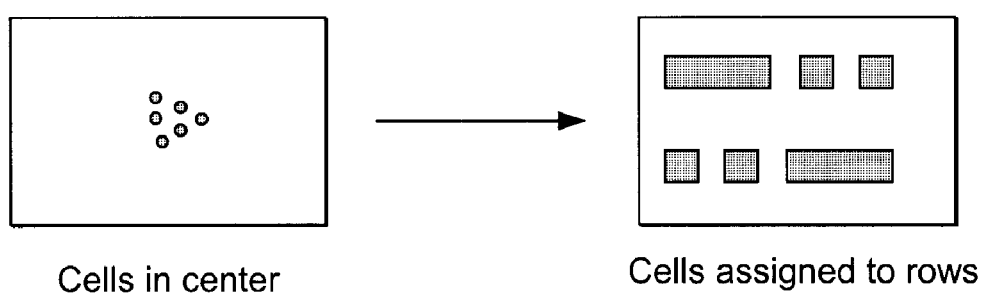
FIG. 7 is a diagram representing detailed placement.

Following the foregoing global placement process, the circuit is then ready for detailed placement in which cells are assigned to placement rows as illustrated in FIG. 7.

Figure 11:
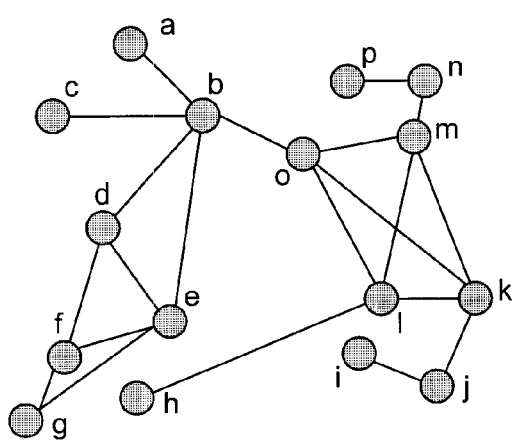
FIG. 11 is a graph representing an example netlist.
Figure 12:
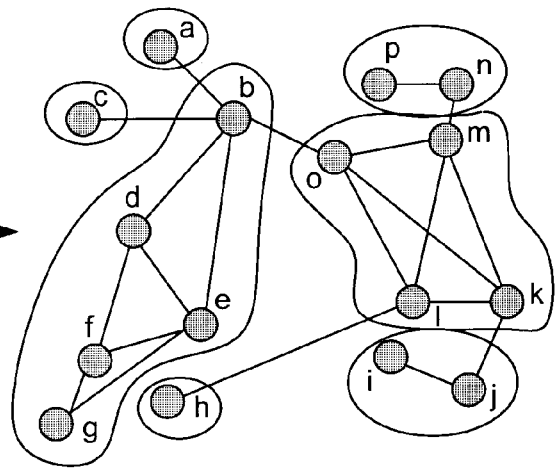
FIG. 12 is a topo-cluster diagram based on the graph of FIG. 11.
Figure 13:
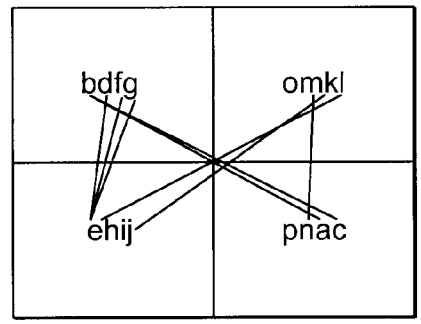
FIG. 13 is a diagram of quanto-clusters formed from the topo-clusters of FIG. 12.

The foregoing process may be more fully understood with reference to a specific example. Referring to FIG. 11, an example netlist is shown as represented by a graph. Each of the nodes a-p represents a cell. As a preliminary step, clustering is performed based on any of the described techniques or other suitable clustering techniques. In the present example, clustering is assumed to result in seven topo-clusters as shown in FIG. 12. Topo-clusters are then placed in bins defined as part of the design layout. For example, referring to FIG. 13, the topo-cluster omkl is placed in the upper right-hand bin, forming its own quanto-cluster. Part of the topo-cluster bdefg is placed in the upper left-hand bin, with the remainder of the topo-cluster (e) being placed in the lower left-hand bin. The cells bdefg therefore form a quanto-cluster. The topo-clusters h and ij are also placed in the lower left-hand bin. The cells ehij form another quanto-cluster. Finally, the topo-clusters pn, a and c are placed in the lower right-hand bin, forming a quanto-cluster. Initially, all of the cells in a bin are placed in the center of the bin.

Figure 14:
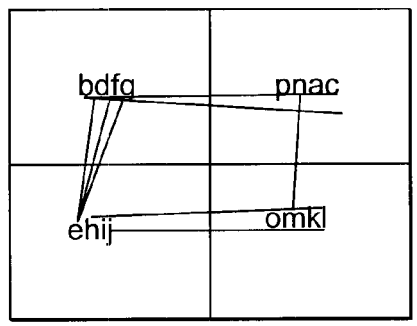
FIG. 14 is a diagram showing the results of a global move during placement refinement.

Placement refinement then ensues, beginning with global moves, i.e., exchange of quanto-clusters, followed by local moves, i.e., exchange of gates. Global moves and local moves are applied within regions (windows) as previously described. In FIG. 14, the window encompasses the upper and lower right-hand bins. Within this window, exchange of the quanto-clusters omkl and pnac results in a cost improvement. In FIG. 15, at a later stage, during a local move phase, the window encompasses the upper and lower left-hand bins. Within this window, exchange of the cells e and g results in a cost improvement.

Following GBFM, quadrisection then follows. Each bin is divided into four smaller bins and the cells within the bin are divided into four groups, each group being parcelled out to a different one of the new smaller bins. In the simplified example, as shown in FIG. 16, quadrisection results in a single cell being placed in the center of each of the resulting cells. The iteration of GBFM and quadrisection therefore concludes, although in the chosen example only a single iteration occurred. In an actual example, a large number of iterations may be expected to occur. The cells are then placed within placement rows (FIG. 17) and subsequently routed (FIG. 18).

The present invention may be embodied in various forms, including computer-implemented methods, computer systems configured to implement such methods, computer-readable media containing instructions for implementing such methods, etc. Examples of computer-implemented methods embodying the invention have been described. Reducing such methods to tangible form as computer-readable media may be accomplished by methods well-known in the art.

Figure 19:
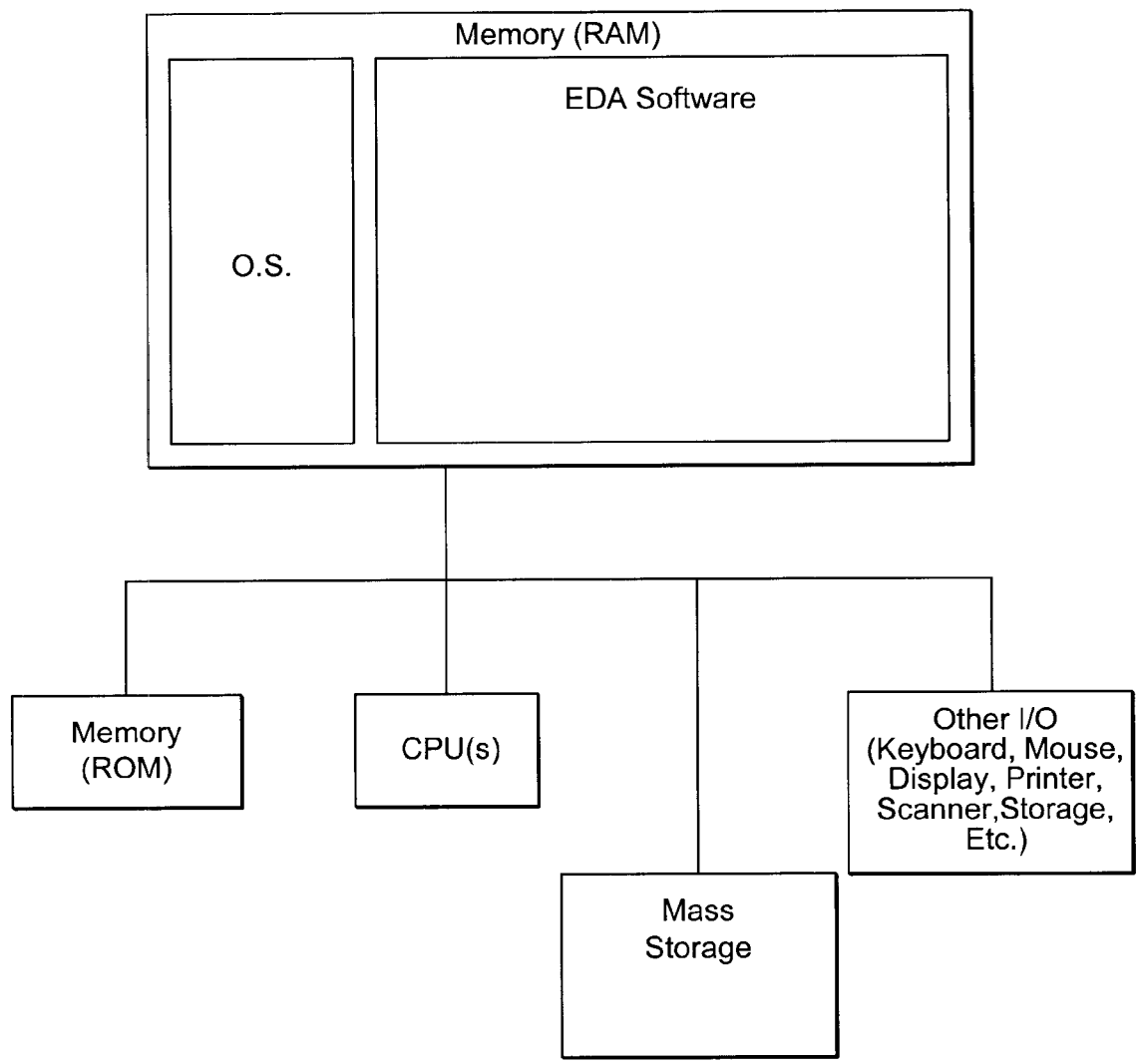
FIG. 19 is a block diagram of a computer system that may be used to practice the present invention.

Referring to FIG. 19, a diagram is shown of a computer system that may be used to practice the present invention. Attached to a system bus are one or more CPUs, read-only memory (ROM), read/write memory (RAM), mass storage, and other I/O devices. The other I/O devices will typically include a keyboard, a pointing device, and a display, and may further include any of a wide variety of commerically-available I/O devices, including, for example, magnetic storage devices, optical storage devices, other storage devices, printers, etc. Stored within memory (e.g., RAM) is EDA software implementing methods of the type previously described. The EDA software.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

It will be appreciated by those of ordinary skill in the art that the invention can be embodied in other specific forms without departing from the spirit or essential character thereof The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of placing circuit elements on an integrated circuit design layout comprising the steps of:

grouping circuit elements into clusters based on topological relatedness of the circuit elements of a cluster;

placing circuit elements by cluster within bins defined on the circuit design layout wherein, for a first cluster, said placing circuit elements by cluster includes repeatedly placing circuit elements from said first cluster in to a centralized bin until the centralized bin reaches capacity and placing remaining circuit elements from said first cluster into a bin which is located in a predetermined spiral order to the centralized bin until all circuit elements of said first cluster have been placed;

defining a continuous region specified by said bins; and applying a placement refinement technique to said continuous region to produce a placement that is improved as measured by a cost function.

2. The method of claim 1, wherein said placement refinement technique comprises moving at least one of circuit elements and clusters between bins within a region.

3. The method of claim 2, wherein within at least some regions both circuit elements and clusters are moved between bins.

4. The method of claim 3, wherein clusters are moved between bins first, and circuit elements are moved between bins afterward.

5. The method of claim 3, comprising the further steps of:

shifting a set of windows by a program-controlled shift amount relative to the integrated circuit design layout to thereby define a set of different regions; and applying said placement refinement technique to at least some of said different regions.

6. The method of claim 5, comprising the further steps of repeating said shifting and applying steps a program-controlled number of times.

7. The method of claim 6, comprising the further steps of, for each of a plurality of iterations:

defining a plurality of regions using a set of windows of a program-controlled size;

applying said placement refinement technique to at least some of said regions;

shifting the set of windows by a program-controlled shift amount relative to the integrated circuit design layout to thereby define a set of different regions;

applying said placement refinement technique to at least some of said different regions; and repeating said shifting and applying steps a program-controlled number of times.

8. The method of claim 1, comprising the further steps of:

quadrisecting said bins;

defining a plurality of different regions; and again applying said placement refinement technique to at least some of the plurality of different regions.

9. The method of claim 8, comprising repeating the steps of quadrisection and again applying said placement refinement technique until each bin contains at most a predetermined number of gates.

10. The method of claim 9, wherein said predetermined number of gates is less than thirty.

11. The method of claim 1, wherein grouping circuit elements comprises grouping circuit elements by similar function.

12. The method of claim 1, wherein grouping circuit elements comprises grouping circuit elements by netlist proximity.

13. The method of claim 1, wherein grouping including the steps of:

creating a first planar subgraph;

creating a second planar subgraph;

repeating the preceding steps until all the nets have been removed.

* * * * *